United States Patent [19]

Martinez

[11] Patent Number: 4,471,408
[45] Date of Patent: Sep. 11, 1984

[54] PIGGYBACK CODE SWITCH DEVICE

[75] Inventor: Louis Martinez, Carson, Calif.

[73] Assignee: McGraw-Edison Company, Rolling Meadows, Ill.

[21] Appl. No.: 336,780

[22] Filed: Jan. 4, 1982

[51] Int. Cl.[3] .............................................. H05K 1/18
[52] U.S. Cl. .............................. 361/392; 174/52 FP; 339/17 CF; 361/400; 361/405; 361/408
[58] Field of Search .............. 361/400, 408, 404, 405, 361/392; 174/52 FP; 339/17 CF

[56] References Cited

U.S. PATENT DOCUMENTS

| | | | |
|---|---|---|---|
| 2,999,918 | 9/1961 | Shafer | 361/408 X |
| 3,693,131 | 9/1972 | Klehm | 339/17 CF |
| 3,912,984 | 10/1975 | Lockhart et al. | 361/400 |
| 3,964,087 | 6/1976 | Mallon | 174/68.5 X |
| 4,168,404 | 9/1979 | Lockard | 361/421 X |
| 4,192,565 | 3/1980 | Gianni | 339/17 CF |
| 4,252,390 | 2/1981 | Bowling | 339/17 CF |
| 4,314,312 | 2/1982 | Donmoyer et al. | 361/400 |
| 4,340,266 | 7/1982 | Grovender | 339/17 CF |

Primary Examiner—R. R. Kucia
Attorney, Agent, or Firm—Blakely, Sokoloff, Taylor & Zafman

[57] ABSTRACT

A piggyback code switch which provides a unique digital code for various types of circuits, for example, garage door openers, load management control receivers, etc., is used with dual-in-line packaging diodes or resistor arrays in such a manner as to enable any combination of resistors or diodes to be pulled to a preselected voltage level and thus provide such circuits with a common starting code. A switch comprising an array of pins extending from a conductive base is placed atop a DIP network. Specific DIP resistors are shorted together by selectively removing the pins of the switch in accordance with a prearranged coding plan. This provides each circuit with a unique digital identification code.

6 Claims, 1 Drawing Figure

PIGGYBACK CODE SWITCH DEVICE

PRIOR ART

In order to provide a unique digital code for various types of circuits, arrays of toggle switches or their equivalent, are employed in what is commonly referred to as dual-in-line packaging (DIP) switches that look indentical to integrated circuits DIP packages. Electronics packages in the DIP configuration have been standardized so as to permit automatic insertion machinery to be employed in manufacturing operations and thus reduce production cost. The disadvantage of miniature DIP switch combinations in these small packages is their cost which frequently exceeds the cost of companion integrated circuits by several cost factors.

Another solution to uniquely encode devices is to employ fuseable links within DIP packages. These links are opened by applying large currents that burn out links in selected paths and these paths are chosen to correspond with the digital code desired. These fuseable link coding devices are also relatively expensive and cannot be recoded. Thus, if a new code is desired, the fuseable link device must be thrown away and a new link inserted.

A further encoding method which has been popular in the prior art utilizes resistor or diode arrays (frequently within the DIP packages) that work in cooperation with other integrated circuits. Each diode or resistor either pulls up or pulls down a terminal pin of a companion integrated circuit (e.g., a shift register) in such a manner as to encode it with the desired digital signature. In order to change a code, the resistor or diode is removed and is replaced with a jumper wire.

SUMMARY OF THE INVENTION

The invention described herein is intended to be used with DIP packaged diode or resistor arrays in such a manner as to enable any combination of resistors or diodes to be pulled to a preselected voltage level (or ground level) and thus provide such circuits with a common "starting code". A switch comprising a metal base having an array of comblike pins extending therefrom is placed atop a DIP network. Specific resistors (or diodes) are shorted together by selectively removing the pins of the switch in accordance with a prearranged coding plan. This provides each circuit with a unique digital identification code.

DETAILED DESCRIPTION OF THE PREFERRED EMBODIMENT

Figure 1:
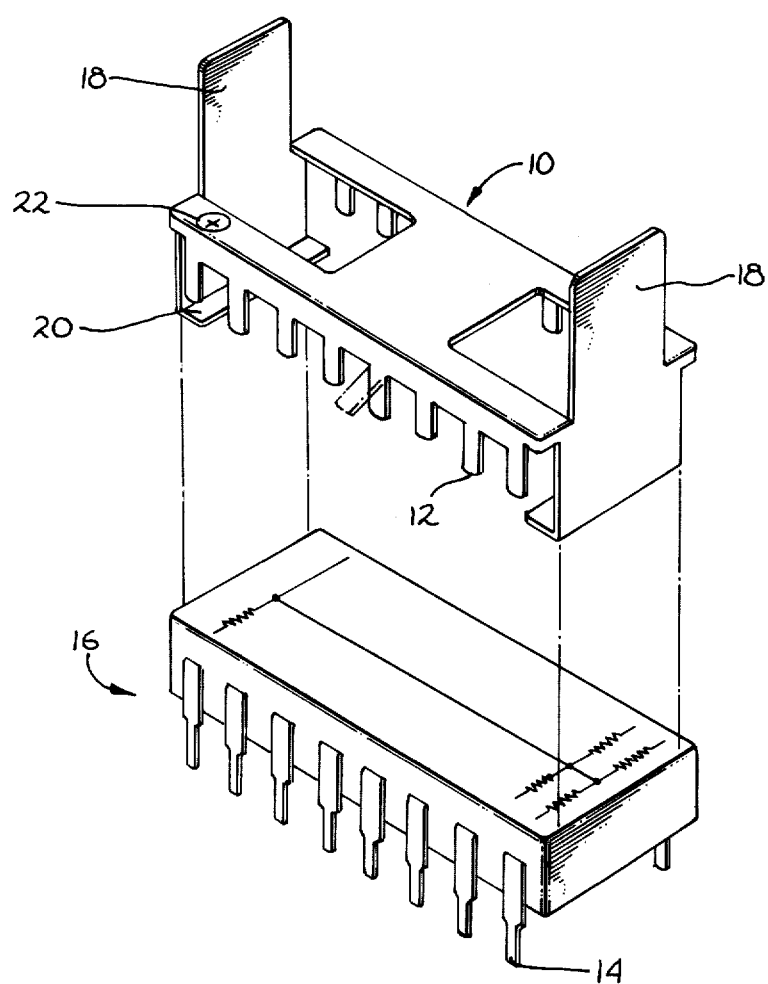
FIG. 1 is a perspective plan view of the piggyback code switch of the present invention applied upon a typical DIP resistor network.

Referring to FIG. 1, a stamped metal part called the piggyback code switch 10 is formed from thin spring sheet metal base such as phosphor bronze having an array of comb-like teeth pins 12 extending therefrom that correspond in position and in dimension to the pins 14 of a typical resistor or diode DIP packaged network 16. Piggyback code switch 10 is intended to clip on DIP network 16 by using the spring-like tabs 18 which, when pressed together, separate holding brackets 20 during installation so that the brackets 20 can clear the body of network 16. Switch 10 is retained in place by the springback force of tabs 18 and the holding action of retainer brackets 20.

Coding is provided by bending back or breaking away selectively any of pins 12 in accordance with the digital code desired. In other words, any pin 12 which is left in place will make contact with a corresponding pin 14 of network 16 causing it to maintain the same common voltage level assigned the body of code switch 10 which, for example, may be at ground level; alternatively, it could be at the supply voltage level.

Piggyback code switch 10 may typically have seven or more pins 12 on each side as in standard integrated circuit DIP packages. These have spacing of 0.1" between pins. A reference mark 22 may be stamped on code switch 10 to identify the direction in which the switch is to be mounted.

A principal feature of this device is that it may be easily removed and replaced manually by pressing tabs 18 toward each other and then replacing switch 10 with another like-device encoded in a new digital code. Piggyback code switches such as described herein can be fabricated inexpensively for a few cents each and thus may be throw-away devices.

What is claimed is:

1. A digital encoding system comprising
   a plurality of resistors in a dual-in-line package having a top, a bottom, two sides and two ends and having a plurality of electrical contacts extending toward said bottom from said sides thereof in a pair of parallel rows of equally spaced contacts for connection to a printed circuit board;
   an electrically conductive metallic encoding device having a body disposed on said top dual-in-line package, and in an unprogrammed state having a plurality of unitary electrically conductive bendable members projecting from said body adjacent each of said two sides of said dual-in-line package in parallel rows of corresponding equally spaced conductive members and elastically urged into electrical contact with said dual-in-line package contacts, whereby said digital encoding system is programmed by permanently bending selected ones of said conductive members outward away from the adjacent said dual-in-line package contact so as to avoid electrical contact therewith;
   said body including unitary mounting members disposed adjacent said ends of said dual-in-line package, each mounting member having a tab projecting partially under said bottom thereof to retain said device to said dual-in-line package; and
   said body further including unitary members projecting away from said top cooperatively disposed with respect to said tabs so that elastically deflecting said last named members toward each other will elastically separate said tabs and withdraw said tabs from under said dual-in-line package.

2. The encoding system of claim 1 wherein said metallic encoding device is a spring sheet metal device.

3. The encoding system of claim 1 wherein said metallic encoding device is a phosphor bronze sheet metal device.

4. A digital encoding device for use with a plurality of resistors in a dual-in-line package having a top, a bottom, two sides and two ends and having a plurality of electrical contacts extending toward said bottom from said sides thereof in a pair of parallel rows of equally spaced contacts for connection to a printed circuit board, comprising an electrically conductive metallic encoding device having a body with ends and sides corresponding to the ends and sides of said dual-in-line package for disposition on said top of said dual-in-line package, and in an unprogrammed state having a plurality of unitary electrically conductive bendable members projecting from said body for disposition adjacent each of said two sides of said dual-in-line package in parallel rows of corresponding equally spaced conductive members and elastically urged into electrical contact with said dual-in-line package contacts when disposed thereover, whereby said device is programmed by permanently bending selected ones of said conductive members outward so as to be positioned away from an adjacent dual-in-line package contact so as to avoid electrical contact therewith when placed thereover;

said body including unitary mounting members disposed at the ends thereof and having facingly disposed tabs which will project partially under the bottom of a dual-in-line package to retain the device thereon; and said body further including unitary members projecting in an opposite direction from said mounting members, and cooperatively disposed with respect to said tabs so that elastically deflecting said last named members towards each other will elastically separate said tabs and withdraw said tabs from under a dual-in-line package for removal of the device therefrom.

5. The encoding device of claim 4 wherein said metallic encoding device is a spring sheet metal device.

6. The encoding device of claim 4 wherein said metallic encoding device is a phosphor bronze sheet metal device.

* * * * *